(12) United States Patent
Yamazaki

(10) Patent No.: US 7,876,161 B2
(45) Date of Patent: Jan. 25, 2011

(54) AMPLIFIER CIRCUIT HAVING FIRST AMPLIFYING SECTION AND SECOND AMPLIFYING SECTION

(75) Inventor: Daisuke Yamazaki, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 12/688,070

(22) Filed: Jan. 15, 2010

(65) Prior Publication Data
US 2010/0109785 A1 May 6, 2010

Related U.S. Application Data

(63) Continuation of application No. PCT/JP2007/067136, filed on Sep. 3, 2007.

(51) Int. Cl.
*H03F 1/52* (2006.01)
(52) U.S. Cl. ..................... 330/298
(58) Field of Classification Search ........... 330/290, 330/298, 302, 310
See application file for complete search history.

(56) References Cited

U.S. PATENT DOCUMENTS 4,496,908 A 1/1985 Takano et al.
6,271,727 B1 * 8/2001 Schmukler .......... 330/284

FOREIGN PATENT DOCUMENTS

| JP | 57-207405 | 12/1982 |
| JP | 5-308233 | 11/1993 |
| JP | 6-314935 | 11/1994 |

OTHER PUBLICATIONS

Behzad Razavi "RF Microelectronics" RF Microelectronics published by Maruzen Co., Ltd., pp. 186-187, Mar. 2002.
International Search Report dated Dec. 4, 2007, from the corresponding International Application.

* cited by examiner

*Primary Examiner*—Steven J Mottola
(74) *Attorney, Agent, or Firm*—Katten Muchin Rosenman LLP (57) ABSTRACT

An amplifier circuit includes a first amplifying section for amplifying a signal, and a second amplifying section for amplifying the signal amplified by the first amplifying section. A capacitive element connects the output of the first amplifying section to the input of the second amplifying section. When power is applied to the amplifier circuit, a bypass circuit causes the electric current flowing from a first power supply toward the input of the second amplifying section through the first amplifying section and the capacitive element to be bypassed to a second power supply.

7 Claims, 8 Drawing Sheets

AMPLIFIER CIRCUIT HAVING FIRST AMPLIFYING SECTION AND SECOND AMPLIFYING SECTION

This application is a continuing application, filed under 35 U.S.C. §111(a), of International Application PCT/JP2007/067136, filed Sep. 3, 2007.

FIELD

The embodiment discussed herein is related to amplifier circuits.

BACKGROUND

Amplifier circuits used for radio communications, such as those incorporated in mobile phones and the like, are needed to have linearity over a wide range, in order to suppress waveform distortion. Also, in recent years, high-frequency band has come to be used because of the demand for high-speed data communications and the shortage of radio band. As amplifier circuits capable of amplification in high-frequency band, a circuit has been known in which a base-grounded transistor is connected to an emitter-grounded transistor (see, e.g., Behzad Razavi (Japanese translation supervised by Tadahiro Kuroda), "RF Microelectronics," p. 187, FIG. 6.2(b)).

Conventionally, bipolar transistors have been used in PA (Power Amplifier) drivers and LNAs (Low Noise Amplifiers). To reduce costs of such amplifier circuits, the use of CMOS (Complementary Metal Oxide Semiconductor) process is an effective measure. Generally, however, CMOS transistors with high withstand (or "breakdown") voltage necessary to provide wide linearity are low in speed, and high-speed transistors have low withstand voltage and fail to provide wide linearity. An amplifier circuit has therefore been proposed in which a high-speed, low-voltage transistor is protected by a low-speed, high-voltage transistor.

Figure 7:
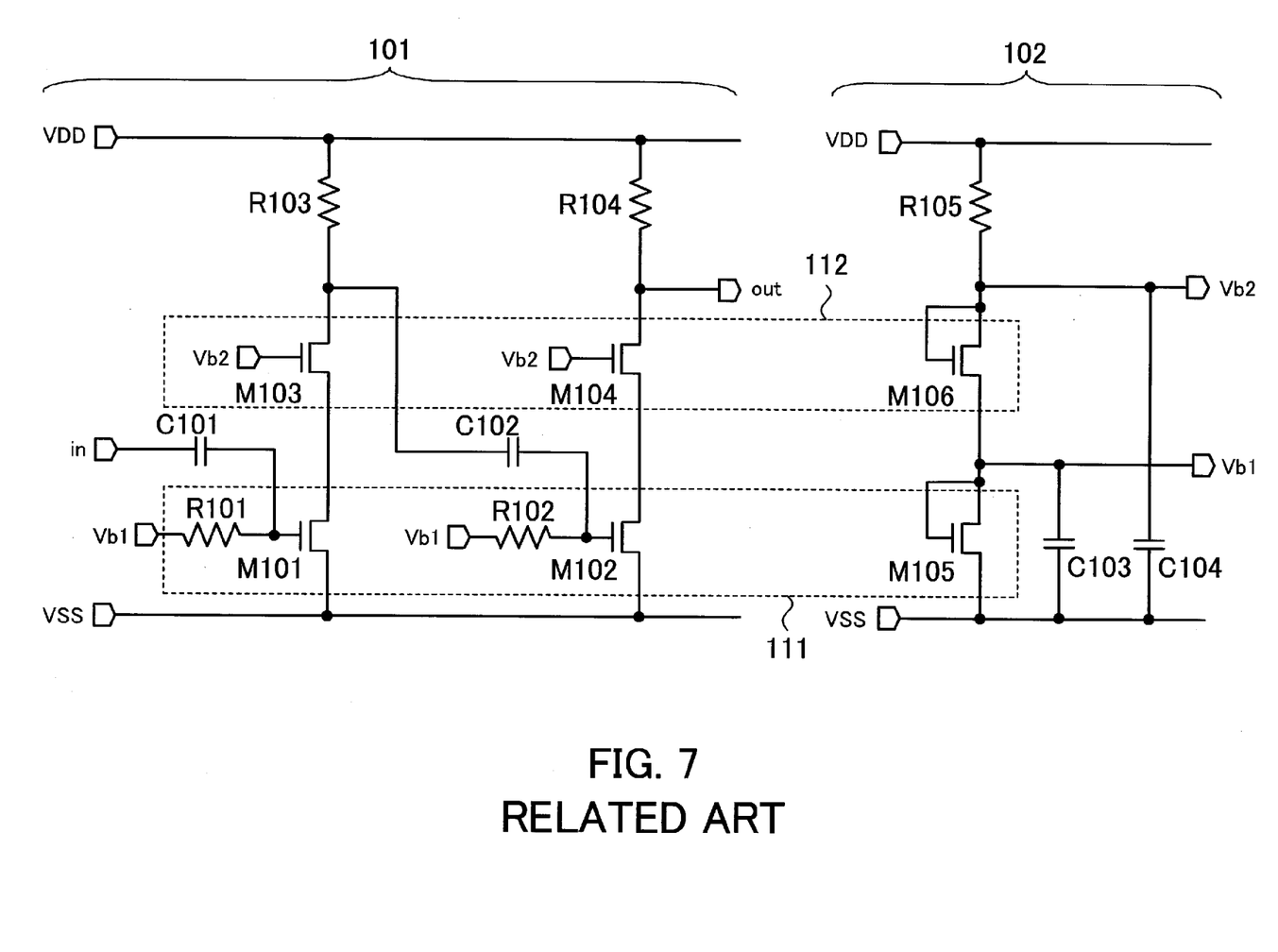
FIG. 7 is a circuit diagram of a conventional amplifier circuit.

FIG. 7 is a circuit diagram illustrating such a conventional amplifier circuit. As illustrated in FIG. 7, the amplifier circuit comprises an amplifying section 101 for amplifying a signal, and a biasing section 102 for applying bias voltages to the amplifying section 101. Transistors M101, M102 and M105 enclosed by a dotted rectangle 111 in FIG. 7 are low-voltage, high-speed NMOS (Negative-channel MOS) transistors, and transistors M103, M104 and M106 enclosed by a dotted rectangle 112 are high-voltage, low-speed NMOS transistors.

In the amplifying section 101, the gate of the transistor M101 receives a bias voltage Vb1 through a resistor R101. Also, the gate of the transistor M101 receives a signal "in" through a capacitor C101. The gate of the transistor M103 receives a bias voltage Vb2.

The signal "in" input to the capacitor C101 is amplified by the transistors M101 and M103. The amplified signal "in" is input to the gate of the transistor M102 through a capacitor C102.

The circuit block comprising the transistors M102 and M104 and resistors R102 and R104 is identical in configuration with the circuit block comprising the transistors M101 and M103 and the resistors R101 and R103. The transistors M102 and M104 receive the bias voltages Vb1 and Vb2, respectively. The signal "in" amplified by the transistors M101 and M103 is further amplified by the transistors M102 and M104 and is output as a signal "out" from the node between the transistor M104 and the resistor R104.

The transistors M101 and M102 constitute a common source circuit, and the transistors M103 and M104 constitute a common gate circuit. The transistors M103 and M104 forming the common gate circuit are connected to the transistors M101 and M102 forming the common source circuit, whereby the gain of the signal "in" is prevented from lowering even in a high-frequency band. Also, the high-voltage, low-speed transistors M103 and M104 are connected to the respective drains of the low-voltage, high-speed transistors M101 and M102 to which the signal "in" is input, whereby the transistors M101 and M102 are protected from a voltage exceeding their withstand voltage, making it possible to implement a high-voltage, high-speed amplifier circuit.

In the biasing section 102, the transistor M105 generates the bias voltage Vb1 applied to the transistors M101 and M102. The transistor M106 generates the bias voltage Vb2 applied to the transistors M103 and M104. The transistors M101, M102 and M105 are fabricated by an identical process so as to have the same characteristics. Similarly, the transistors M103, M104 and M106 are fabricated by an identical process so as to have the same characteristics. Further, the resistors R103, R104 and R105 are fabricated by an identical process so as to have the same characteristics.

It is therefore possible to supply the bias voltages Vb1 and Vb2 as threshold voltages to the transistors M101 and M102 and the transistors M103 and M104, respectively. It is also possible to supply the bias voltages Vb1 and Vb2 that have the same temperature characteristics and the like as the respective threshold voltages of the transistors M101 and M102 and the transistors M103 and M104.

Capacitors C103 and C104 serve to keep the bias voltages Vb1 and Vb2 from varying with voltage fluctuation of a power supply VDD.

Figure 8:
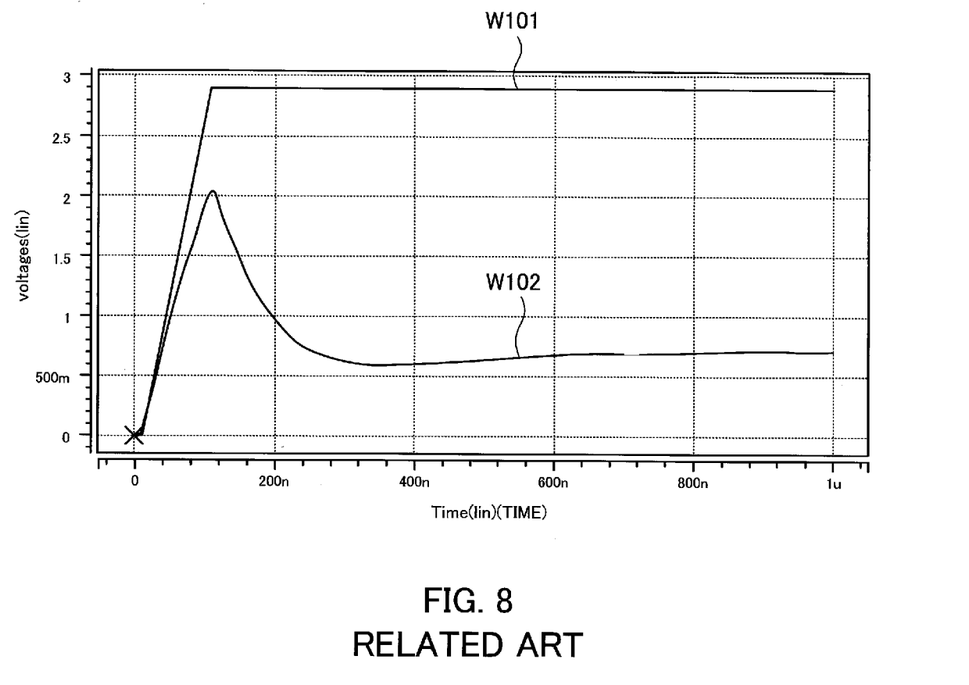
FIG. 8 illustrates voltage changes of the amplifier circuit of FIG. 7.

FIG. 8 illustrates voltage changes of the amplifier circuit illustrated in FIG. 7. In FIG. 8, waveform W101 indicates a voltage change of the power supply VDD, and waveform W102 indicates a change in the gate voltage of the transistor M102. It is assumed here that in the amplifier circuit of FIG. 7, the transistors M101 and M102 have a withstand voltage of 1.2 V while the transistors M103 and M104 have a withstand voltage of 3.3 V.

When the voltage of the power supply VDD rises as indicated by the waveform W101 in FIG. 8, the bias voltages Vb1 and Vb2 rise with a slope gentler than that of the voltage rise of the power supply VDD, because the capacitors C103 and C104 are connected. Accordingly, while the voltage of the power supply VDD keeps rising, the transistors M101 and M103 experience a period in which their impedances are high.

Since the impedances of the transistors M101 and M103 become high, an electric current flows to the capacitor C102 through the resistor R103 due to the voltage rise of the power supply VDD. Consequently, the gate voltage of the transistor M102 rises beyond the withstand voltage 1.2 V up to about 2.1 V, as indicated by the waveform W102 in FIG. 8.

When the bias voltages Vb1 and Vb2 rise to a level high enough to switch on the respective transistors M101 and M103, a current begins to flow to the transistors M101 and M103. As a result, the gate voltage of the transistor M102 lowers as indicated by the waveform W102 in FIG. 8. The gate voltage of the transistor M102 thereafter stabilizes at around 0.7 V. After the gate voltage of the transistor M102 is stabilized at about 0.7 V which is lower than the withstand voltage, the operation of the amplifier circuit becomes stable.

Thus, in the conventional amplifier circuit, a voltage exceeding the withstand voltage is applied to the transistor when power is applied to the amplifier circuit, giving rise to the problem that degradation of the transistor is caused.

SUMMARY

According to one aspect of the present invention, an amplifier circuit for amplifying a signal includes a first amplifying section configured to amplify the signal, a second amplifying section configured to amplify the signal amplified by the first amplifying section, a capacitive element connecting an output of the first amplifying section to an input of the second amplifying section, and a bypass circuit configured such that when power is applied to the amplifier circuit, an electric current flowing from a first power supply toward the input of the second amplifying section through the first amplifying section and the capacitive element is bypassed to a second power supply.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

The principles of the present invention will be described in detail below with reference to the drawings.

Figure 1:
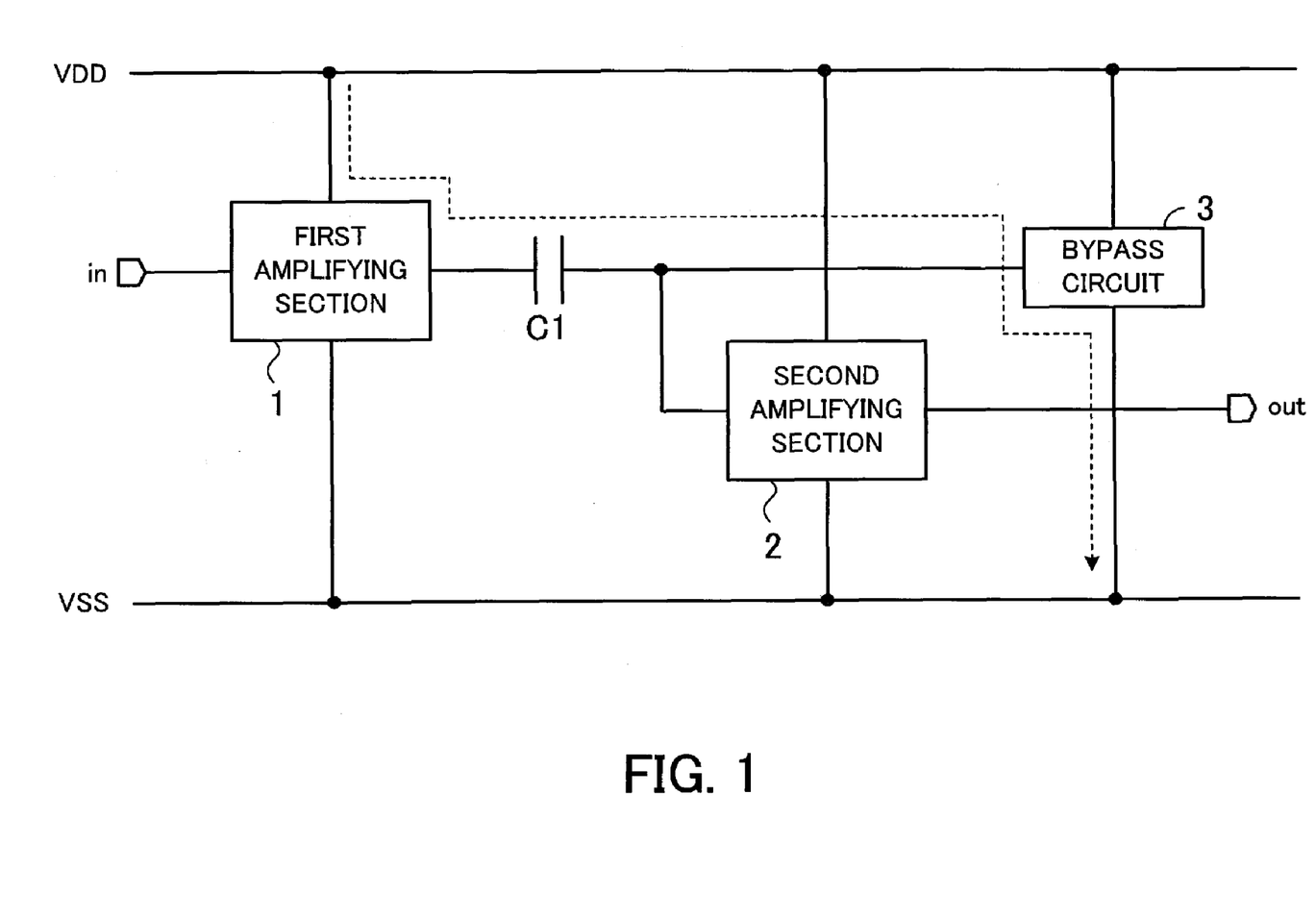
FIG. 1 schematically illustrates an amplifier circuit.

FIG. 1 schematically illustrates an amplifier circuit. As illustrated in FIG. 1, the amplifier circuit comprises a first amplifying section 1, a second amplifying section 2, a bypass circuit 3, and a capacitive element C1.

The first amplifying section 1 amplifies a signal "in". The second amplifying section 2 amplifies the signal "in" amplified by the first amplifying section 1 and outputs the amplified signal as a signal "out". The first and second amplifying sections 1 and 2 are each applied with voltages from first and second power supplies VDD and VSS.

The capacitive element C1 connects the output of the first amplifying section 1 to the input of the second amplifying section 2. Accordingly, the signal "in" amplified by the first amplifying section 1 is applied through the capacitive element C1 to the second amplifying section 2.

The bypass circuit 3 is configured such that when power is applied to the amplifier circuit, an electric current flowing from the first power supply VDD toward the input of the second amplifying section 2 through the first amplifying section 1 and the capacitive element C1 due to the voltage rise of the first power supply VDD is bypassed to the second power supply VSS. This current flow is indicated by the dotted arrow in FIG. 1.

When the voltage of the first power supply VDD becomes stable after rising, the input impedance of the bypass circuit 3 turns high. Thus, once the first power supply VDD stabilizes, the signal "in" amplified by the first amplifying section 1 does not flow to the bypass circuit 3.

In this manner, when power is applied to the amplifier circuit, the current flowing from the first power supply VDD toward the second amplifying section 2 through the first amplifying section 1 and the capacitive element C1 is bypassed to the second power supply VSS. Accordingly, the second amplifying section 2 is prevented from being applied with a voltage higher than the withstand voltage when power is applied to the amplifier circuit, whereby circuit degradation can be prevented.

An embodiment of the present invention will be now described in detail with reference to the accompanying drawings.

Figure 2:
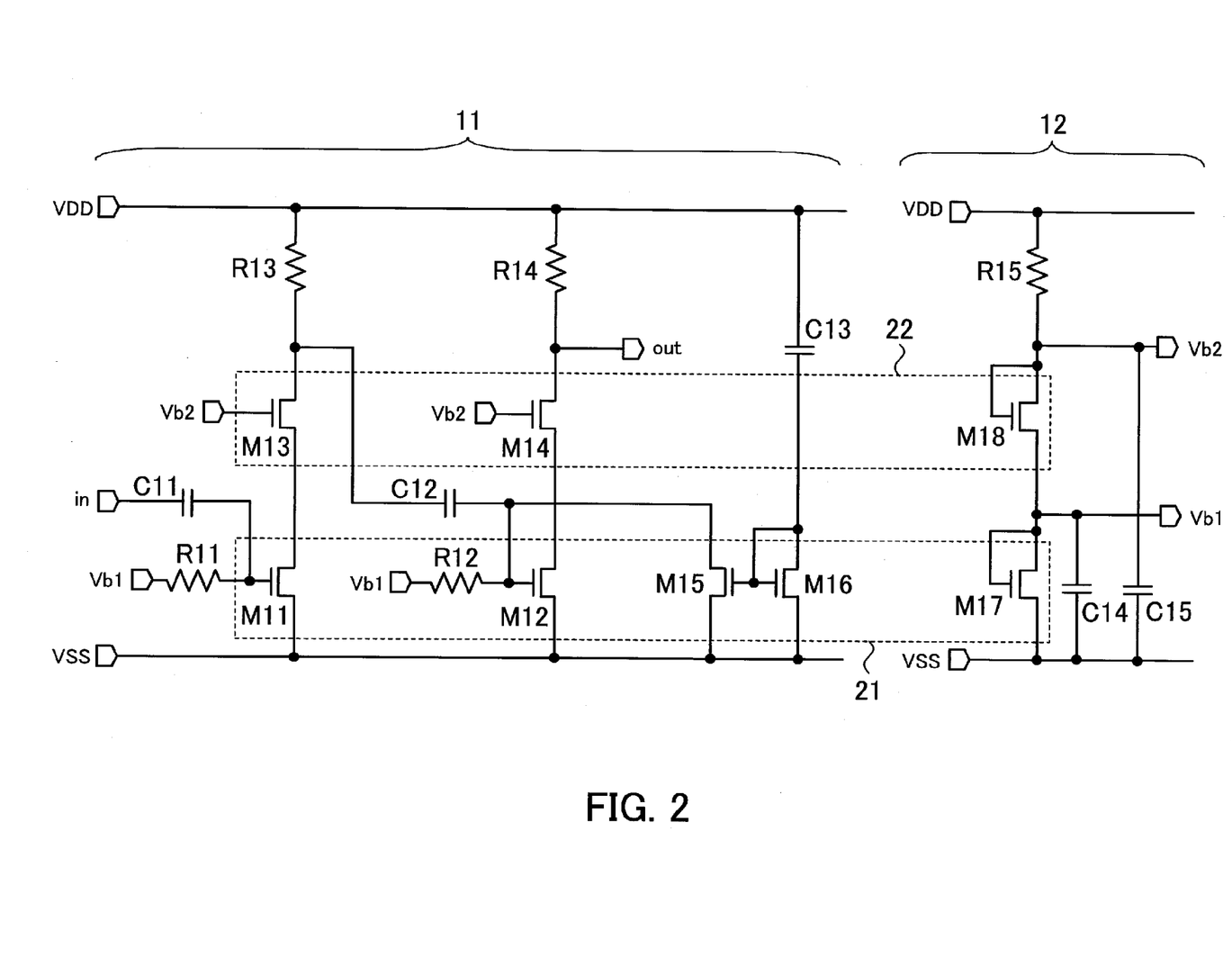
FIG. 2 is a circuit diagram of the amplifier circuit.

FIG. 2 is a circuit diagram of the amplifier circuit. As illustrated in FIG. 2, the amplifier circuit comprises an amplifying section 11 for amplifying a signal, and a biasing section 12 for applying bias voltages to the amplifying section 11. Transistors M11, M12 and M15 to M17 enclosed by a dotted rectangle 21 in FIG. 2 are low-voltage, high-speed NMOS transistors, and transistors M13, M14 and M18 enclosed by a dotted rectangle 22 are high-voltage, low-speed NMOS transistors. The amplifier circuit of FIG. 2 is used, for example, in a transmitting power amplifier driver or receiving LNA of a mobile terminal for performing radio communication such as OFDM (Orthogonal Frequency Division Multiplexing).

In the amplifying section 11, the gate of the transistor M11 receives a bias voltage Vb1 through a resistor R11. Also, the gate of the transistor M11 receives a signal "in" through a capacitor C11. The gate of the transistor M13 receives a bias voltage Vb2.

The signal "in" input to the capacitor C11 is amplified by the transistors M11 and M13. The amplified signal "in" is input to the gate of the transistor M12 through a capacitor C12.

The circuit block comprising the transistors M12 and M14 and resistors R12 and R14 is identical in configuration with the circuit block comprising the transistors M11 and M13 and the resistors R11 and R13. The transistors M12 and M14 receive the bias voltages Vb1 and Vb2, respectively. The signal "in" amplified by the transistors M11 and M13 is further amplified by the transistors M12 and M14 and is output as a signal "out" from the node between the transistor M14 and the resistor R14. The transistors M11 and M13 and the resistor R13 constitute a first-stage amplifying section, and the transistors M12 and M14 and the resistor R14 constitute a second-stage amplifying section.

Also, the transistors M11 and M12 constitute a common source circuit, and the transistors M13 and M14 constitute a common gate circuit. The transistors M13 and M14 forming the common gate circuit are connected to the transistors M11 and M12 forming the common source circuit, whereby the gain of the signal "in" is prevented from lowering even in a high-frequency band. Further, the high-voltage, low-speed transistors M13 and M14 are connected to the respective drains of the low-voltage, high-speed transistors M11 and M12 to which the signal "in" is input, whereby the transistors M11 and M12 are protected from a voltage exceeding their withstand voltage, making it possible to implement a high-voltage, high-speed amplifier circuit.

The transistor M16 and a capacitor C13 are connected between power supplies VDD and VSS. The gate and drain of the transistor M16 are connected to each other.

The gate of the transistor M15 is connected to the transistor M16. Also, the drain of the transistor M15 is connected to the gate of the transistor M12 as well as to the capacitor C12. The transistors M15 and M16 constitute a current mirror circuit.

When the voltage of the power supply VDD rises, an electric current flows to the capacitor C13 and the transistor M16. As the current flows through the transistor M16, an equal amount of current also flows through the transistor M15 because of the current mirror configuration. Consequently, when the voltage of the power supply VDD rises, the current flowing through the capacitor C12 toward the gate of the transistor M12 is drawn into the transistor M15 and bypassed to the power supply VSS, thereby restraining rise in the gate voltage of the transistor M12.

The capacitors C12 and C13 are made to have the same characteristics. For example, the capacitors C12 and C13 are fabricated by an identical process so as to have the same capacitance. Also, the transistors M12, M15 and M16 are made to have the same characteristics. For example, the transistors M12, M15 and M16 are fabricated by an identical process so as to have the same gate length and gate width.

Thus, the current flowing through the capacitor C13 and the transistor M16 can be made equal to that flowing through the capacitor C12 and the transistor M15, except for a difference attributable to the resistor R13. Since the transistor M16 is connected like a diode, its drain voltage does not become higher than about 0.7 V. Also, the drain voltage of the transistor M15 as well as the gate voltage of the transistor M12 do not rise above 0.7 V during the voltage rise time of the power supply VDD.

Once the voltage of the power supply VDD becomes constant, no current flows to the capacitor C13. As a result, the gate voltages of the transistors M15 and M16 become equal to the voltage (0 V) of the power supply VSS, so that the impedance of the transistor M15 turns high. Namely, after the power supply VDD is stabilized, the connection of the gate of the transistor M12 is virtually the same as that of the transistor M102 of the amplifier circuit illustrated in FIG. 7 (the transistor M15 is virtually disconnected from the transistor M12).

In the biasing section 12, the transistor M17 generates the bias voltage Vb1 applied to the transistors M11 and M12. The transistor M18 generates the bias voltage Vb2 applied to the transistors M13 and M14. The transistors M11, M12 and M17 are fabricated by an identical process so as to have the same characteristics. Similarly, the transistors M13, M14 and M18 are fabricated by an identical process so as to have the same characteristics. Further, the resistors R13, R14 and R15 are fabricated by an identical process so as to have the same characteristics.

It is therefore possible to supply the bias voltages Vb1 and Vb2 as threshold voltages to the transistors M11 and M12 and the transistors M13 and M14, respectively. It is also possible to supply the bias voltages Vb1 and Vb2 that have the same temperature characteristics and the like as the respective threshold voltages of the transistors M11 and M12 and the transistors M13 and M14.

Capacitors C14 and C15 serve to keep the bias voltages Vb1 and Vb2 from varying with voltage fluctuation of the power supply VDD.

Figure 3:
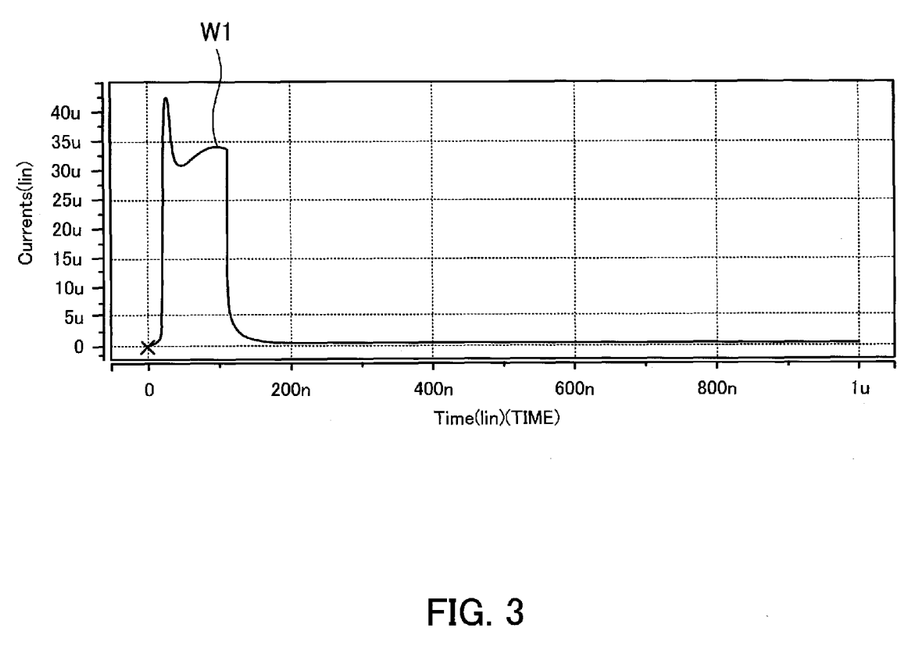
FIG. 3 illustrates a current flowing to a transistor for bypassing a current to a power supply.

FIG. 3 illustrates a current flowing through the transistor for bypassing the current to the power supply. Specifically, waveform W1 in FIG. 3 indicates the drain-to-source current of the transistor M15 in FIG. 2.

Suppose that power is applied to the amplifier circuit of FIG. 2 at time "0" (t=0). Thereupon, the voltage of the power supply VDD rises, and as a result, a current flows to the capacitor C13 and the transistor M16. Because of the current mirror configuration, the current flowing through the transistor M16 is mirrored in the associated transistor M15, so that a current indicated by the waveform W1 in FIG. 3 flows from the drain to the source of the transistor M15.

After the voltage of the power supply VDD is stabilized, no current flows to the capacitor C13, and thus no current flows to the transistor M15. The waveform W1 in FIG. 3 illustrates an exemplary case where the voltage of the power supply VDD keeps rising for a period of 100 nsec and thereafter becomes constant. As seen from the graph, the current flowing through the transistor M15 drops to "0" after a lapse of 100 nsec.

Figure 4:
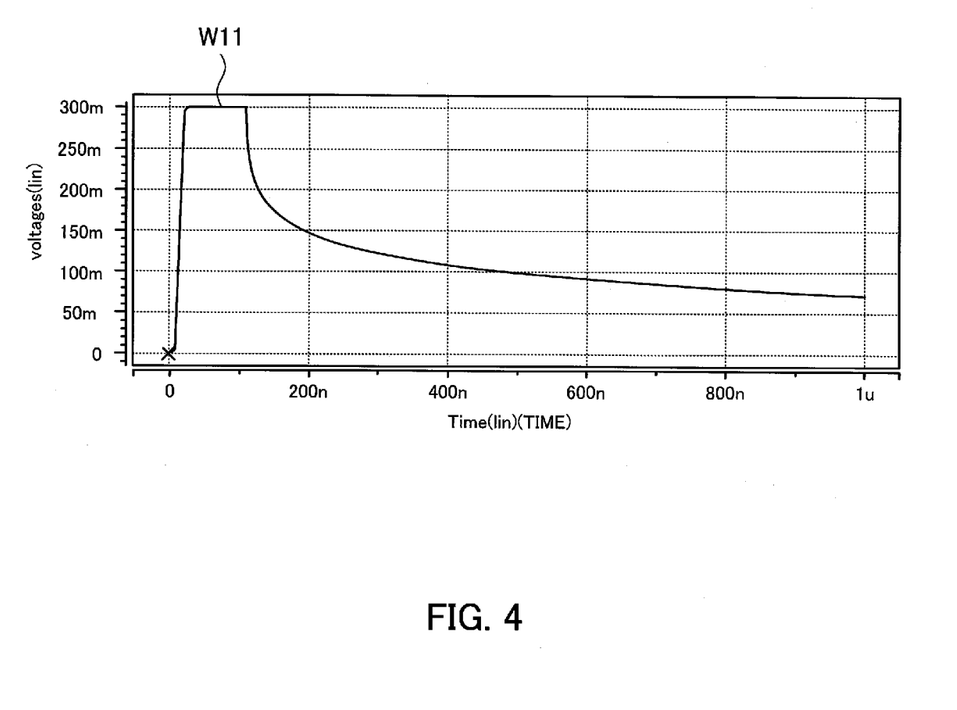
FIG. 4 illustrates a voltage applied to the transistor for bypassing the current to the power supply.

FIG. 4 illustrates the voltage applied to the transistor for bypassing the current to the power supply. Specifically, waveform W11 in FIG. 4 indicates the gate-source voltage of the transistor M15 in FIG. 2.

As in the case of FIG. 3, power is applied to the amplifier circuit of FIG. 2 at time "0" (t=0). The voltage of the power supply VDD rises, and as a consequence, a current flows to the capacitor C13 and the transistor M16. The current flowing into the transistor M16 also flows to the gate of the transistor M15, so that the gate voltage of the transistor M15 rises as indicated by the waveform W11.

After the voltage of the power supply VDD stabilizes, no current flows to the capacitor C13, and accordingly, no current flows to the transistor M15. The waveform W11 in FIG. 4 illustrates an exemplary case where the voltage of the power supply VDD keeps rising for a period of 100 nsec and thereafter becomes constant. After a lapse of 100 nsec, the gate voltage of the transistor M15 gradually decreases, as indicated by the waveform W11, due to leakage of the current to the source.

Figure 5:
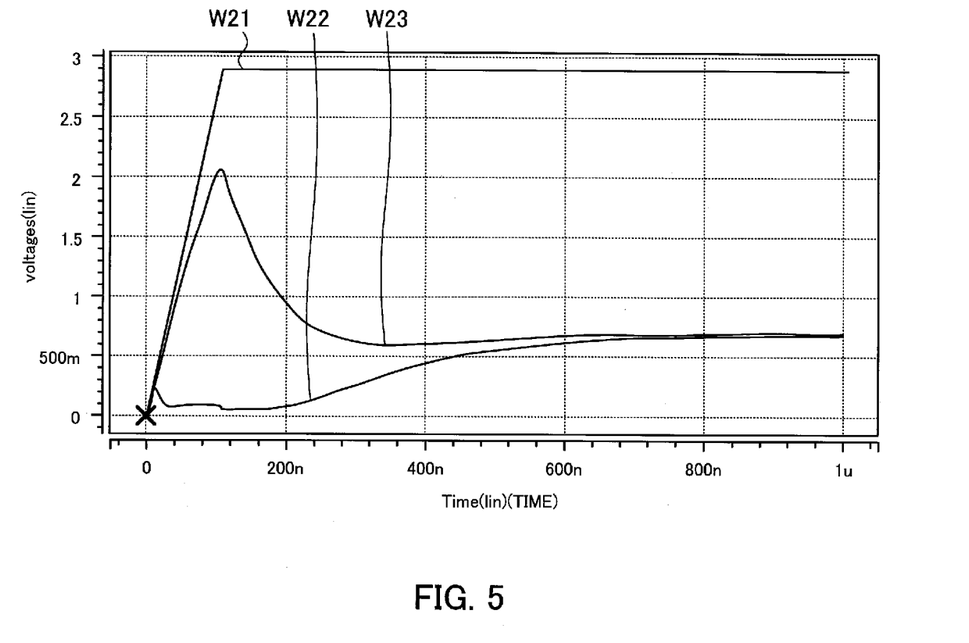
FIG. 5 illustrates voltage changes of the amplifier circuit of FIG. 2.

FIG. 5 illustrates voltage changes of the amplifier circuit of FIG. 2. In FIG. 5, waveform W21 indicates a voltage change of the power supply VDD illustrated in FIG. 2. Let us suppose that power is applied to the amplifier circuit at time "0" (t=0) and that the voltage of the power supply VDD keeps rising for a period of 100 nsec, as indicated by the waveform W21.

Waveform W22 indicates a change in the gate voltage of the transistor M12 in FIG. 2. As the voltage of the power supply VDD rises following the start, a current flows through the resistor R13 and the capacitor C12 illustrated in FIG. 2. Also, a current flows through the capacitor C13 and the transistor M16. Because of the current mirror configuration, the current flowing through the capacitor C13 and the transistor M16 is mirrored in the transistor M15, so that the current flowing through the resistor R13 and the capacitor C12 is bypassed to the power supply VSS by the transistor M15. Consequently, the gate voltage of the transistor M12 gradually rises, as indicated by the waveform W22, and does not become higher than the withstand voltage (1.2 V) of the transistor M12.

After the voltage of the power supply VDD becomes stable, no current flows from the power supply VDD to the capacitor C12 or C13. The gate charges of the transistors M15 and M16 are gradually discharged because of the leakage current and become "0" (0 V), so that the impedance of the transistor M15 turns high. Once the voltage of the power supply VDD is stabilized, therefore, the transistor M15 exerts substantially no influence on the signal "in".

Waveform W23 indicates a change in the gate voltage of the transistor M102 in FIG. 7. The conventional amplifier circuit illustrated in FIG. 7 does not have a transistor for drawing in the current flowing toward the gate of the transistor M102, like the transistor M15 in FIG. 2. Thus, the current flowing through the resistor R103 and the capacitor C102 reaches the gate of the transistor M102, with the result that the gate voltage sharply rises, as indicated by the waveform W23. Consequently, the gate of the transistor M102 is applied with a voltage exceeding the withstand voltage (1.2 V), as indicated by the waveform W23.

Figure 6:
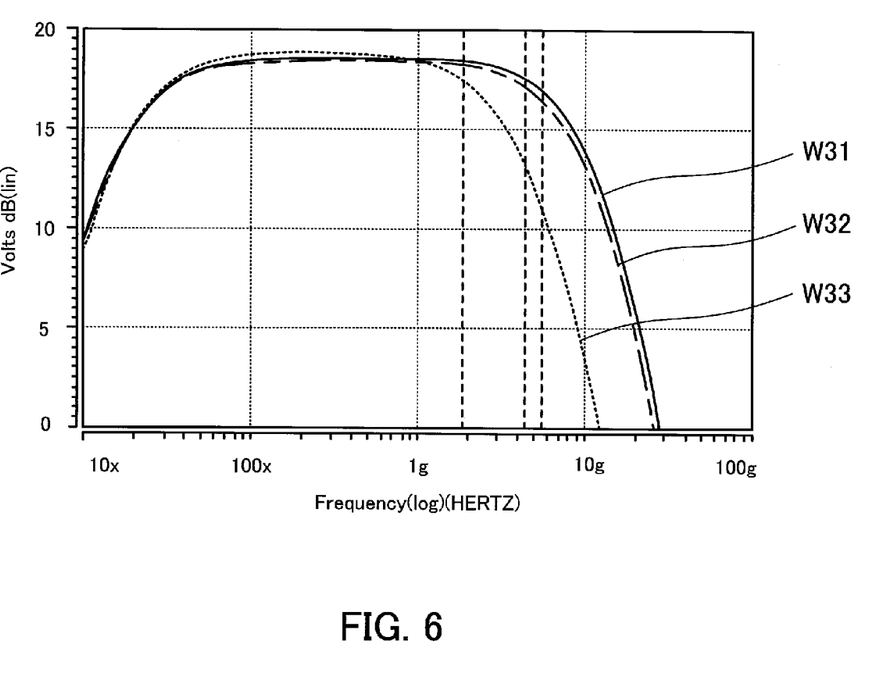
FIG. 6 illustrates the frequency characteristic of the amplifier circuit of FIG. 2.

FIG. 6 illustrates the frequency characteristic of the amplifier circuit illustrated in FIG. 2. In FIG. 6, waveform W31 illustrates the frequency characteristic of the amplifier circuit illustrated in FIG. 7. In the case of the amplifier circuit of FIG. 7, the frequency at which the voltage gain drops by 3 dB is 5.1 GHz, as indicated by the waveform W31.

On the other hand, waveform W32 indicates the frequency characteristic of the amplifier circuit illustrated in FIG. 2. In the amplifier circuit of FIG. 2, the frequency at which the voltage gain drops by 3 dB is 4.4 GHz, as indicated by the waveform W32.

Also, waveform W33 indicates the frequency characteristic observed in the case where all of the transistors in the amplifier circuit of FIG. 7 are constituted by low-speed, high-voltage transistors. As indicated by the waveform W33, the frequency at which the voltage gain drops by 3 dB is 1.9 GHz.

Where all transistors of the amplifier circuit are constituted by low-speed, high-voltage transistors, the frequency characteristic is narrower, as indicated by the waveform W33, than in the case where high-speed, low-voltage transistors are used as in the amplifier circuit of FIG. 7.

In the amplifier circuit of FIG. 2, the impedance of the transistor M15 turns high as soon as the power supply VDD stabilizes, and therefore, the influence exerted on the signal "in" by the transistor M15 is very small. Since the drain of the transistor M15 has a very small capacitance, however, the bandwidth somewhat narrows as indicated by the waveform W32, compared with the waveform W31 obtained with the amplifier circuit of FIG. 7. Nevertheless, the difference is as small as 0.7 GHz (=5.1 GHz−4.4 GHz), thus ensuring a satisfactorily wide bandwidth as compared with the case where all transistors are constituted by low-speed, high-voltage transistors.

In this manner, when power is applied to the amplifier circuit, the current flowing from the power supply VDD toward the gate of the transistor M12 through the resistor R13 and the capacitor C12 due to the voltage rise of the power supply VDD is bypassed to the power supply VSS. It is therefore possible to prevent the gate of the transistor M12 from being applied with a voltage higher than the withstand voltage when power is applied to the amplifier circuit, whereby degradation of the transistor M12 can be prevented.

In mobile devices such as mobile phones, power-down control is repeatedly executed within the IC (Integrated Circuit) in order to reduce the consumption of electric power, with the result that the power supply is frequently started and stopped. By applying the amplifier circuit of FIG. 1 to such an IC, therefore, it is possible to prevent degradation of the IC.

Further, once the voltage of the power supply VDD stabilizes, the impedance of the transistor M15 turns high and thus exerts only a small influence upon the frequency characteristic of the signal "in".

In the foregoing embodiment, all of the transistors are constituted by NMOS transistors but may alternatively be constituted by PMOS (Positive-channel MOS) transistors.

Also, in the above description of the invention, the bypass circuit is applied to a common-source amplifier. Alternatively, the bypass circuit may be applied to a differential pair amplifier, and also in this case, the gate of the transistor can be prevented from being applied with an overvoltage when the power supply voltage rises.

In the amplifier circuit of the present invention, when power is applied to the amplifier circuit, the electric current flowing from the first power supply toward the second amplifying section through the first amplifying section and the capacitive element is bypassed to the second power supply. Accordingly, the second amplifying section is prevented from being applied with a voltage higher than its withstand voltage when power is applied to the amplifier circuit, making it possible to prevent circuit degradation.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that various changes, substitutions and alterations could be made hereto without departing from the spirit and scope of the invention.

What is claimed is:

1. An amplifier circuit for amplifying a signal, comprising:
a first amplifying section configured to amplify the signal;
a second amplifying section configured to amplify the signal amplified by the first amplifying section;
a capacitive element connecting an output of the first amplifying section to an input of the second amplifying section; and
a bypass circuit configured such that when power is applied to the amplifier circuit, an electric current flowing from a first power supply toward the input of the second amplifying section through the first amplifying section and the capacitive element is bypassed to a second power supply.

2. The amplifier circuit according to claim 1, wherein impedance of the bypass circuit turns high when voltage of the first power supply is stabilized.

3. The amplifier circuit according to claim 1, wherein the bypass circuit includes:
a bypass capacitive element and a first bypass transistor connected in series between the first and second power supplies; and
a second bypass transistor having a drain connected to the capacitive element, to allow an electric current identical in amount with that flowing through the first bypass transistor to flow therethrough.

4. The amplifier circuit according to claim 3, wherein the second amplifying section includes:
a first amplifying transistor connected to the capacitive element through which the signal amplified by the first amplifying section is received; and
a second amplifying transistor having a source connected to a drain of the first amplifying transistor, the second amplifying transistor being higher in breakdown voltage and lower in speed than the first amplifying transistor.

5. The amplifier circuit according to claim 4, wherein the first amplifying transistor and the first and second bypass transistors have identical characteristics.

6. The amplifier circuit according to claim 3, wherein the capacitive element and the bypass capacitive element have identical characteristics.

7. The amplifier circuit according to claim 3, wherein the first and second bypass transistors constitute a current mirror circuit.

* * * * *